United States Patent [19]
Bischof

[11] Patent Number: 5,093,640
[45] Date of Patent: Mar. 3, 1992

[54] MICROSTRIP STRUCTURE HAVING CONTACT PAD COMPENSATION

[75] Inventor: Richard S. Bischof, Santa Rosa, Calif.

[73] Assignee: Hewlett-Packard Company, Palo Alto, Calif.

[21] Appl. No.: 414,832

[22] Filed: Sep. 29, 1989

[51] Int. Cl.⁵ .............................................. H01P 5/00
[52] U.S. Cl. ....................................... 333/33; 333/246
[58] Field of Search ........................... 333/33, 246, 238

[56] References Cited

U.S. PATENT DOCUMENTS

| | | | |
|---|---|---|---|
| 3,419,813 | 12/1968 | Kamnitsis | 333/34 X |
| 3,462,713 | 8/1969 | Knerr | 333/238 X |
| 3,573,670 | 4/1971 | Skobern | 333/33 |
| 4,186,358 | 1/1980 | Czech et al. | 333/33 |
| 4,673,958 | 6/1987 | Bayraktaroglu | 333/33 X |
| 4,870,375 | 9/1989 | Krueger, Jr. et al. | 333/33 |
| 4,891,612 | 1/1990 | Gleason et al. | 333/33 |

FOREIGN PATENT DOCUMENTS

| | | | |
|---|---|---|---|
| 65729 | 3/1956 | France | 333/33 |
| 73651 | 6/1977 | Japan | 333/33 |

*Primary Examiner*—Eugene R. LaRoche
*Assistant Examiner*—Benny Lee
*Attorney, Agent, or Firm*—William C. Milks, III

[57] ABSTRACT

A microstrip structure includes a microstrip transmission line having a characteristic impedance, a contact pad for interconnection of the transmission line to an external device, and a compensation line connected between the contact pad and one end of the microstrip transmission line. The contact pad has larger dimensions than the transmission line and thus introduces parasitic capacitance. The compensation line is a narrow line having high impedance and is selected such that its equivalent inductance resonates with the parasitic capacitance at the upper frequency of the range of frequencies over which the transmission line is intended to be operated, thereby matching the contact pad to the transmission line.

20 Claims, 3 Drawing Sheets

MICROSTRIP STRUCTURE HAVING CONTACT PAD COMPENSATION

FIELD OF THE INVENTION

This invention relates to microstrip transmission lines and, more particularly, to a microstrip structure including compensation for contact pads having larger dimensions than the transmission line.

BACKGROUND OF THE INVENTION

Microstrip transmission lines are widely used in microwave applications. Such transmission lines include a dielectric substrate having a ground plane on one side and a conductive line on the other side, which together form a transmission line having a characteristic impedance, typically 50 ohms. The transmission line structure is fabricated using conventional photolithographic or screen printing techniques. Microstrip transmission lines are used to interconnect components in a microwave system and are typically mounted with other components in a metal enclosure or housing.

When the microstrip transmission line on the chosen substrate is used at frequencies in the gigahertz range, the linewidth to provide a 50 ohm impedance is on the order of about 0.6 millimeter. In order to interconnect such a transmission line to an RF connector or to other microstrip circuits, it is necessary to provide a contact pad having larger dimensions than the transmission line. The contact pad has a different impedance from the remainder of the transmission line because of parasitic capacitance between the excess width of the contact pad and the ground plane. As a result, there is a mismatch in the transmission line impedance, which causes undesired reflections.

It is known in the prior art to reduce or eliminate the parasitic capacitance of a contact pad by removing the ground plane on the back of the substrate and by providing a recess in the housing adjacent to the contact pad. While this technique is effective, it increases the cost of the assembly since the ground plane must be patterned, and additional machining is required to form the recess in the housing.

An additional disadvantage of removing the ground plane is that is fails to compensate for the parasitic impedance of the connection element which is attached to the contact pad. It is therefore desirable to provide a compensation technique which compensates for the impedance of the contact pad without increasing the manufacturing cost of the assembly.

It is a general object of the present invention to provide improved microstrip transmission lines.

It is another object of the present invention to provide microstrip transmission lines having compensation for contact pad impedance.

It is a further object of the present invention to provide microstrip transmission lines which are low in cost and easy to manufacture.

It is still another object of the present invention to provide microstrip transmission lines wherein the parasitic impedance of contact pads is incorporated into a filter.

SUMMARY OF THE INVENTION

According to the present invention, these and other objects and advantages are achieved in a microstrip structure comprising a substrate of dielectric material, a transmission line having a characteristic impedance on a first side of the substrate, a contact pad on the first side of the substrate for interconnection of the transmission line to an external device, the contact pad having a low impedance relative to the characteristic impedance of the transmission line, a compensation line on the first side of the substrate interconnecting the transmission line and the contact pad, the compensation line having a high impedance relative to the characteristic impedance, and a ground plane on a second side of the substrate. The transmission line, the contact pad and the compensation line typically comprise a continuous metallization on a surface of the substrate.

The microstrip structure is typically fabricated such that the transmission line has a first width, the contact pad has a second width greater than the width of the transmission line and the compensation line has a third width less than the width of the transmission line. The contact pad has a region of increased width relative to the transmission line, which introduces parasitic capacitance. The compensation line has a region of reduced width relative to the transmission line. Preferably, the region of increased width of the contact pad has about the same surface area as the region of reduced width of the compensation line.

The region of increased width has an equivalent capacitance, and the compensation line has an equivalent inductance. The characteristics of the contact pad and the compensation line are selected such that the equivalent capacitance and the equivalent inductance have a resonant frequency at or above the highest frequency at which the circuit is intended to be operated.

The microstrip structure typically further includes a connection element attached to the contact pad. The connection element has dimensions in a portion which attaches to the contact pad equal to or less than the dimensions of the contact pad. In a preferred embodiment, the compensation line is dimensioned to compensate not only for the parasitic capacitance of the contact pad but also for the parasitic capacitance of the connection element.

BRIEF DESCRIPTION OF THE DRAWINGS

For a better understanding of the present invention together with other and further objects, advantages and capabilities thereof, reference is made to the accompanying drawings which are incorporated herein by reference and in which.

DESCRIPTION OF THE PRIOR ART

Figure 1:
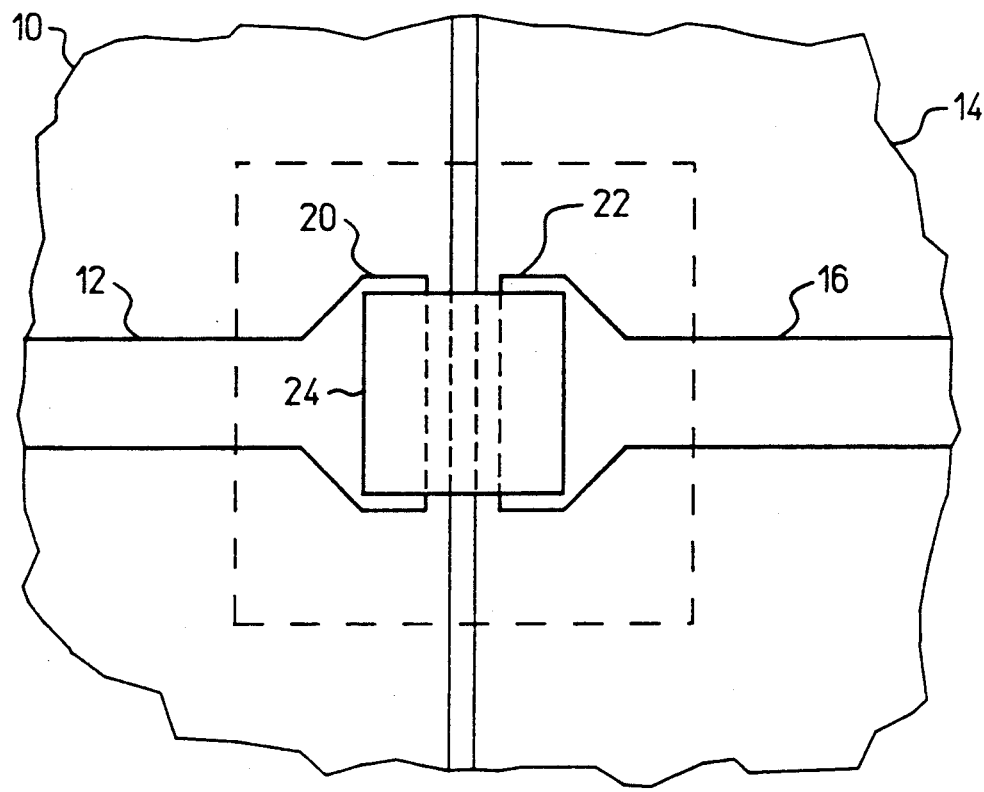
FIG. 1 is a top view of a microstrip transmission line interconnection arrangement in accordance with the prior art.
Figure 2:
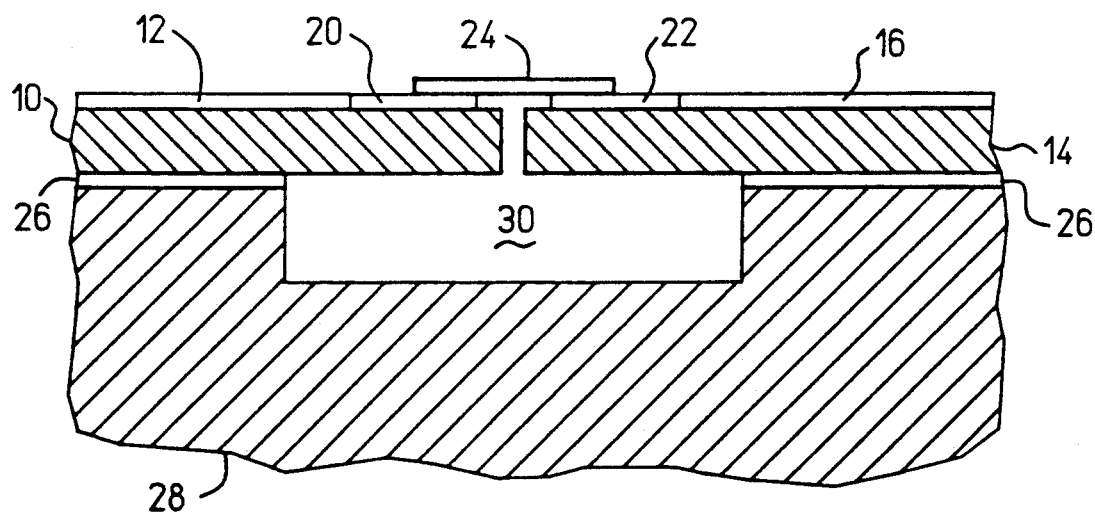
FIG. 2 is a cross-sectional view of the interconnection arrangement of FIG. 1.

A structure for interconnecting two microstrip transmission lines in accordance with the prior art is shown in FIGS. 1 and 2. A dielectric substrate 10 has a microstrip transmission line 12 formed thereon, and a substrate 14 has a microstrip transmission line 16 formed thereon. Contact pads 20 and 22 are formed at the ends of transmission lines 12 and 16, respectively. The transmission lines 12 and 16 and the contact pads 20 and 22 are metallizations on the substrates. The contact pads 20 and 22 are electrically connected by a connecting element 24. The substrates 10 and 14 are mounted in a metal housing 28, as shown in FIG. 2.

The contact pads 20 and 22 are wider than the transmission lines 12 and 16, and parasitic capacitance is a problem. More specifically, the contact pads 20 and 22 have a higher capacitance per unit length than transmission lines 12 and 16. To reduce or eliminate parasitic capacitance between each contact pad 20, 22 and a ground plane 26 on the back surface of each of the substrates 10 and 14, the ground plane 26 is removed under the contact pads 20 and 22, and a recess 30 is formed in the RF housing 28, as shown in FIG. 2. As a result, the capacitance between contact pads 20 and 22 and the nearest ground is reduced. However, the removal of ground plane 26 and the machining of recess 30 adds to the cost of the assembly. In addition, this technique does not compensate for parasitic impedance of connecting element 24.

DETAILED DESCRIPTION OF THE INVENTION

Figure 3:
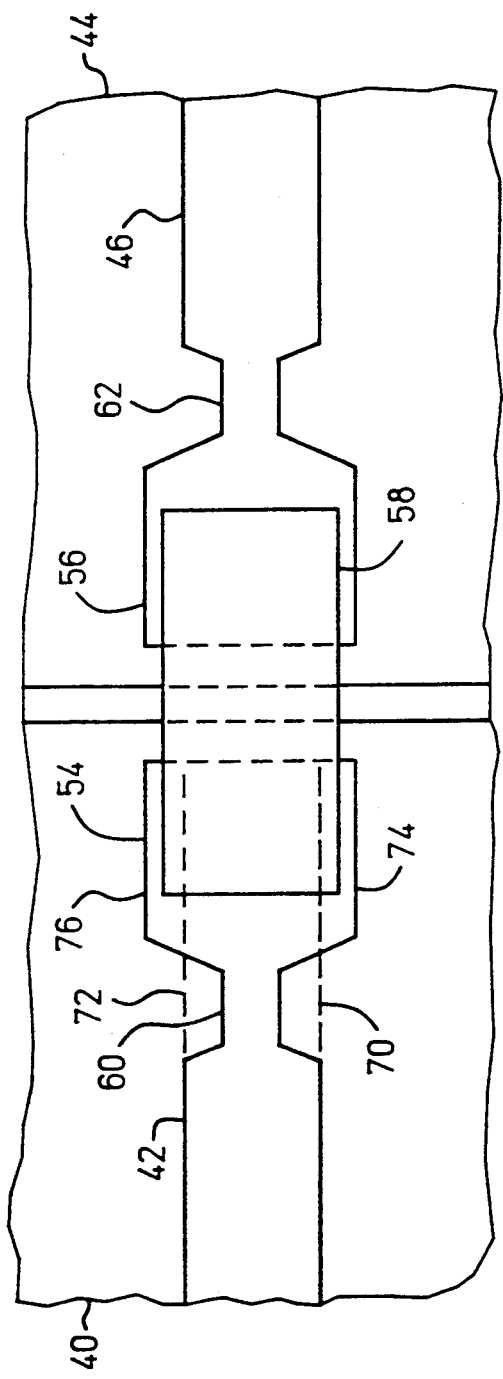
FIG. 3 is a top view of a configuration for interconnecting two microstrip transmission lines in accordance with the present invention.
Figure 4:
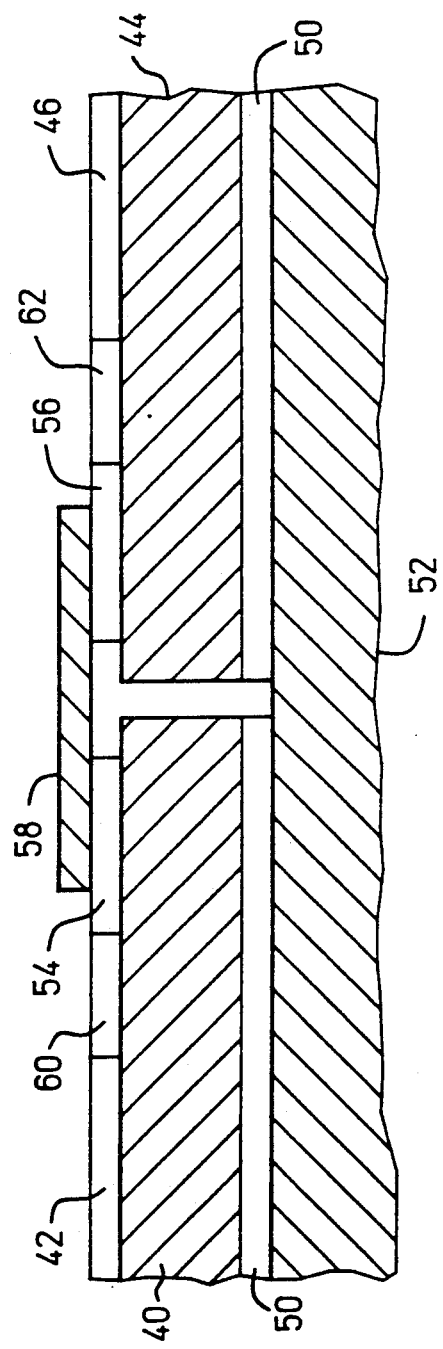
FIG. 4 is a cross-sectional view of the microstrip transmission line interconnection arrangement of FIG. 3.

In accordance with the present invention, compensation is provided for a contact pad attached to a microstrip transmission line without patterning the ground plane or machining a recess in the housing. Referring now to FIGS. 3 and 4, a substrate 40 has a transmission line 42 formed thereon and a substrate 44 has a microstrip transmission line 46 formed thereon. Each substrate 40, 44 has a ground plane 50 on a back surface thereof, and both substrates are mounted with the respective ground planes in contact with a metal housing 52, as shown in FIG. 4. A contact pad 54 is formed at the end of transmission line 42 near the edge of substrate 40, and a contact pad 56 is formed at the end of transmission line 46 near the edge of substrate 44. The contact pads 54 and 56 are interconnected by a connecting element 58. The contact pads 54 and 56 are wider than the respective transmission lines to provide sufficient area for connecting element 58.

In accordance with the present invention, a high impedance section 60 interconnects transmission line 42 and contact pad 54, and a high impedance section 62 interconnects transmission line 46 and contact pad 56. The high impedance sections 60 and 62 compensate for the impedance of contact pads 54 and 56, respectively, as described hereinafter.

The substrates 40, 44 are a suitable dielectric material such as alumina. The transmission lines 42, 46, contact pads 54, 56 and the high impedance sections 60, 62 are patterned conductive regions, which are formed by conventional photolithographic or screen printing techniques. The connecting element 58 can be a conductive elastomer, a nonconductive elastomer having a metallized surface, a gold ribbon, or other conductive metal ribbon.

As discussed above, the relatively wide contact pads 54 and 56 have higher capacitance to the ground plane 50 than the transmission lines 42 and 46. The higher capacitance causes a mismatch in the transmission lines which, in turn, causes reflections and causes transmission to vary as a function of frequency. The high impedance sections 60 and 62 each have an equivalent inductance which forms a resonant circuit with the equivalent capacitance of the respective contact pad. The resonant frequency is at or above the highest frequency in the range of frequencies over which the transmission line is intended to be operated. In effect, high impedance section 60 and contact pad 54 form a lowpass filter, and high impedance section 62 and contact pad 56 form a lowpass filter. In the present example, the resonant frequency of each lowpass filter is 3 gigahertz, the maximum frequency at which the transmission lines 42 and 46 are intended to be operated. The lowpass filters have a Chebyshev characteristic.

The high impedance sections 60, 62 are conductive strips which are narrower than both the transmission lines 42, 46 and the contact pads 54, 56. As a first approximation, high impedance section 60 can be formed such that the reduction in area of section 60 relative to transmission line 42 is about the same as the increase in area of contact pad 54 relative to transmission line 42. That is, the total area of regions 70 and 72 equals the total area of regions 74 and 76 (see FIG. 3).

As a further refinement, the dimensions of high impedance sections 60 and 62 can be calculated using known microstrip transmission line formulas. More specifically, reference is made to T. C. Edwards, *Foundations for Microstrip Circuit Design*, Wiley 1981, page 45, section 3.5.2 for equations for the characteristic impedance of microstrip transmission lines and to Matthaei, Young and Jones, *Microwave Filters Impedance Matching Networks and Coupling Structures*, McGraw Hill 1964, page 361, FIG. 7.02-1 for equations for determining the equivalent capacitance and the equivalent inductance of microstrip transmission lines. These formulas are used as follows. First, the impedance of the contact pads 54, 56 is determined using the Edwards formulas. Then, the equivalent capacitance of the contact pads is determined using the Matthaei et al formulas. Next, an inductance is selected to resonate with the equivalent capacitance at the desired upper cutoff frequency. A minimum linewidth in the high impedance sections 60, 62 is selected based on process considerations. Finally, the Matthaei et al formulas are used to determine the length of high impedance sections 60 and 62, and the Edwards formula is used to determine the characteristic impedance. The values determined by these formulas can be optimized using known microwave simulator programs such as HP 85150B Microwave Design System, EESOF TOUCHSTONE, or Compact Microwave Design Workstation.

In a preferred embodiment, the microstrip transmission lines are designed to operate up to a frequency of 3 gigahertz. Thus, the upper cutoff frequency of the resonant circuit is 3 gigahertz. In an example of a suitable microstrip structure, the substrates 40 and 44 are 25 mil thick alumina. The transmission lines 42 and 46 have a width of 0.60 millimeter. The length of each contact pad 54, 56 is 0.80 millimeter and its width is 1.00 millimeter. Each contact pad 54, 56 is spaced from the edge of the respective substrate by 0.20 millimeter. The high impedance regions 60, 62 have a length of 0.30 millimeter and a width of 0.15 millimeter.

The connecting element 58 should have the same or slightly smaller dimensions than the contact pads 54, 56 to avoid overlap by connecting element 58. If connecting element 58 were to overlap the contact pads, the effective capacitance would be increased relative to the capacitance used to calculate the dimensions of the high impedance section, and a variation in performance would occur. The connecting element 58 is preferably somewhat smaller in dimension than the contact pads 54, 56 to allow for manufacturing error in placement of the connecting element 58. The high impedance sections 60, 62 can take into account the parasitic impedance of the connecting element 58 that interconnects the contact pads 54, 56 to thereby optimize impedance match, for example, by adjusting the length of the high impedance sections.

Figure 5:
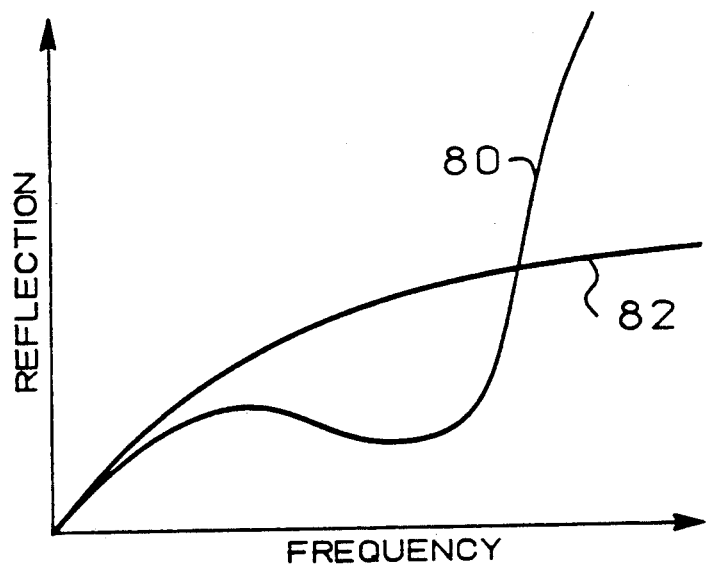
FIG. 5 is a graphic representation of reflection as a function of frequency showing a comparison of the present invention with the prior art.

A comparison of the performance of the prior art arrangement shown in FIGS. 1 and 2, and the present invention, as shown in FIGS. 3 and 4 and described hereinabove, is shown in FIG. 5. The reflection from the contact region is plotted as a function of frequency. The reflection performance of the present invention is plotted as curve 80, while the reflection performance of the prior art configuration is plotted as curve 82. At frequencies below the cutoff frequency, the reflection in accordance with the present invention is equal to or lower than the prior art configuration.

Figure 6:
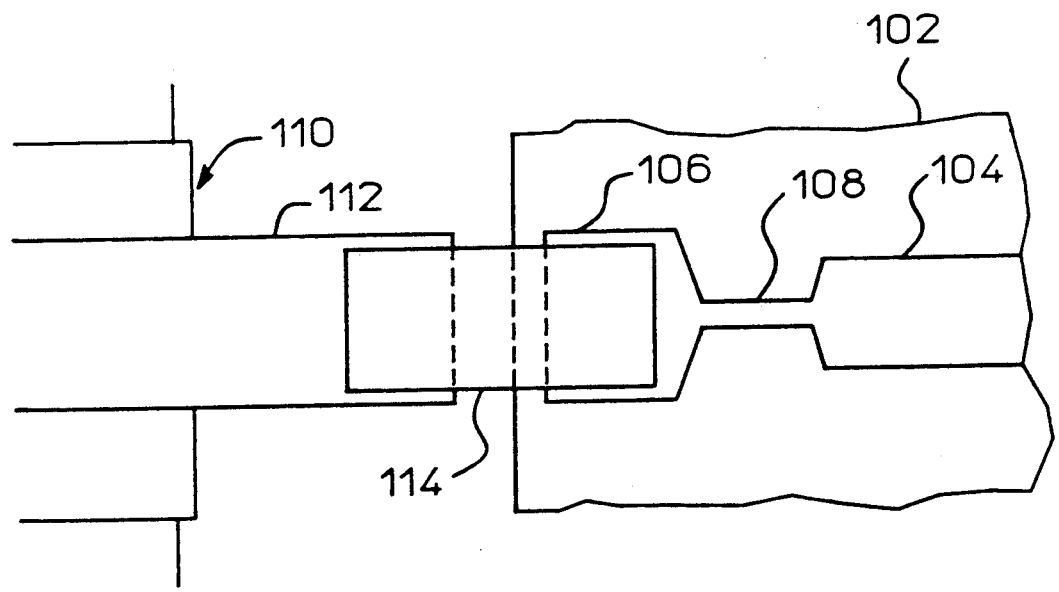
FIG. 6 is a top view of a configuration for interconnecting a microstrip transmission line to a coaxial connector.

An alternate embodiment of the present invention is shown in FIG. 6. A substrate 102 has a transmission line 104 formed thereon. A contact pad 106 is interconnected to the transmission line 104 with a high impedance section 108. The structure shown in FIG. 6 provides a connection between transmission line 104 and an SMA-type RF connector 110. The contact pad 106 is electrically connected to a center pin 112 of connector 110 by a connecting element 114. In this embodiment, the high impedance section 108 compensates for the capacitance of contact pad 106 in the same manner described hereinabove in connection with FIGS. 3 and 4. The high impedance section 109 can take into account the parasitic impedance of the connecting element 114 that interconnects the contact pad 106 and the center pin 112 to thereby optimize impedance match, for example, by adjusting the length of the high impedance section.

In an example of the embodiment of FIG. 6, the substrate 102 is 25 mil thick alumina, and the microstrip transmission line 104 has a width of 0.60 millimeter. The contact pad 106 has a length of 0.80 millimeter and a width of 1.30 millimeter. High impedance section 108 has a width of 0.15 millimeter and a length of 0.60 millimeter. This example was designed to operate up to a frequency of 3 gigahertz.

In summary, the present invention provides compensation for the impedance of an enlarged, or oversized, contact pad by providing a high impedance section of transmission line in series connection between the contact pad and the microstrip transmission line. The high impedance section is selected to resonate with the additional capacitance of the contact pad at or above the upper frequency of the range of frequencies over which the transmission line is intended to be operated. The high impedance section and the contact pad together form a lowpass filter and effectively match the contact pad to the microstrip transmission line. A further advantage of the compensation technique is that the high impedance section can take into account the impedance of the connecting element that interconnects the contact pad to another contact pad or device and thereby further optimizes the impedance match. Typically, the impedance mismatch caused by the connecting element is less than the mismatch caused by the contact pad.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A microstrip structure comprising:
   a substrate of dielectric material;
   a transmission line disposed on a first side of said substrate, said transmission line having a first width and a characteristic impedance;
   a contact pad disposed on the first side of said substrate for interconnection of said transmission line to an external device, said contact pad having a second width greater than said first width and a low impedance relative to said characteristic impedance;
   a compensation line disposed on the first side of said substrate interconnecting said transmission line and said contact pad, said compensation line having a third width less than said first width and a high impedance relative to said characteristic impedance;
   said transmission line, said contact pad and said compensation line comprising a metallization layer disposed on said first side of said substrate;
   a connection element attached to said contact pad for interconnection to said external device, said connection element having a fourth width in a portion which attaches to said contact pad, said fourth width of said connection element being not more than said second width of said contact pad; and
   a ground plane disposed on a second side of said substrate.

2. A microstrip structure as defined in claim 1 wherein said compensation line comprises a conductor having a predefined length.

3. A microstrip structure as defined in claim 2 wherein said length of said compensation line is predefined to compensate for parasitic capacitance of said contact pad.

4. A microstrip structure as defined in claim 3 wherein said length of said compensation line is further predefined to compensate for parasitic impedance of said connection element.

5. A microstrip structure as defined in claim 1 wherein said contact pad has a region of increased width relative to said width of said transmission line and wherein said compensation line has a region of reduced width relative to said width of said transmission line, said region of increased width having a surface area about the same as a surface area of said region of reduced width.

6. A microstrip structure as defined in claim 5 wherein said region of increased width characterizes an equivalent capacitance and said compensation line characterizes an equivalent inductance, the characteristics of said compensation line being such that said equivalent capacitance and said equivalent inductance realize a resonant frequency not less than a highest frequency in a range of frequencies over which said transmission line is operated.

7. A microstrip structure as defined in claim 1 wherein said characteristic impedance is about 50 ohms.

8. A microstrip structure comprising:
a transmission line having a first width and a characteristic impedance;
a contact pad for interconnection of said transmission line to a device, said contact pad comprising at least a portion having a second width greater than said first width and a low impedance relative to said characteristic impedance; and
a compensation line connected between said contact pad and one end of said transmission line, said compensation line comprising at least a portion having a third width less than said first width and a high impedance relative to said characteristic impedance;
said transmission line, said contact pad and said compensation line comprising a metallization layer disposed on a surface of a substrate;
said contact pad having a region of increased width relative to said first width of said transmission line and said compensation line having a region of reduced width relative to said first width of said transmission line, said region of increased width having a surface area about the same as a surface area of said region of reduced width.

9. A microstrip structure as defined in claim 8 wherein said characteristic impedance is about 50 ohms.

10. A microstrip structure as defined in claim 8 wherein said compensation line comprises a conductor having a predefined length.

11. A microstrip structure as defined in claim 8 wherein said region of increased width characterizes an equivalent capacitance and said compensation line characterizes an equivalent inductance, the characteristics of said compensation line being such that said equivalent capacitance and said equivalent inductance realize a resonant frequency not less than a highest frequency in a range of frequencies over which said transmission line is operated.

12. A microstrip structure comprising:
a substrate of dielectric material;
a transmission line disposed on a first side of said substrate, said transmission line having a first width and a characteristic impedance;
a contact pad disposed on the first side of said substrate for interconnection of said transmission line to an external device, said contact pad having a second width greater than said first width and a low impedance relative to said characteristic impedance, a region of increased surface area of said contact pad having said second width relative to said transmission line having said first width characterizing an equivalent capacitance;
a compensation line disposed on the first side of said substrate interconnecting said transmission line and said contact pad, said compensation line having a third width less than said first width and a high impedance relative to said characteristic impedance, said compensation line characterizing an equivalent inductance;
said transmission line, said contact pad and said compensation line comprising a metallization layer disposed on said first side of said substrate, the characteristics of said compensation line being such that said equivalent capacitance and said equivalent inductance realize a resonant frequency not less than a highest frequency in a range of frequencies over which said transmission line is operated; and
a ground plane disposed on a second side of said substrate.

13. A microstrip structure as defined in claim 12, further comprising a connection element attached to said contact pad for interconnection to said external device, said connection element having a fourth width in a portion which attaches to said contact pad, said fourth width of said connection element being not more than said second width of said contact pad.

14. A microstrip structure as defined in claim 13 wherein said compensation line comprises a conductor having a predefined length.

15. A microstrip structure as defined in claim 14 wherein said length of said compensation line is predefined to compensate for parasitic capacitance of said contact pad.

16. A microstrip structure as defined in claim 15 wherein said length of said compensation line is further predefined to compensate for parasitic impedance of said connection element.

17. A microstrip structure as defined in claim 12 wherein said characteristic impedance is about 50 ohms.

18. A microstrip structure as defined in claim 12 wherein said compensation line comprises a conductor having a predefined length.

19. A microstrip structure as defined in claim 18 wherein said length of said compensation line is predefined to compensate for parasitic capacitance of said contact pad.

20. A microstrip structure as defined in claim 12 wherein said contact pad has a region of increased width relative to said width of said transmission line and wherein said compensation line has a region of reduced width relative to said transmission line, said region of increased width having a surface area about the same as a surface area of said region of reduced width.

* * * * *